(12) United States Patent
Feng

(10) Patent No.: US 10,845,934 B2
(45) Date of Patent: Nov. 24, 2020

(54) OLED DISPLAY PANEL

(71) Applicant: Wuhan China Star Optoelectronics Semiconductor Display Technology Co., Ltd., Wuhan (CN)

(72) Inventor: Xiaoliang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 92 days.

(21) Appl. No.: 16/316,354

(22) PCT Filed: Dec. 24, 2018

(86) PCT No.: PCT/CN2018/123104
§ 371 (c)(1),
(2) Date: Jan. 9, 2019

(87) PCT Pub. No.: WO2020/113701
PCT Pub. Date: Jun. 11, 2020

(65) Prior Publication Data
US 2020/0174602 A1 Jun. 4, 2020

(30) Foreign Application Priority Data
Dec. 3, 2018 (CN) .......................... 2018 1 1464089

(51) Int. Cl.
*G06F 3/047* (2006.01)
*H01L 27/32* (2006.01)
*G06F 3/041* (2006.01)

(52) U.S. Cl.
CPC ............ *G06F 3/047* (2013.01); *G06F 3/0412* (2013.01); *H01L 27/323* (2013.01); *H01L 27/3246* (2013.01); *G06F 2203/04111* (2013.01)

(58) Field of Classification Search
CPC ................... G06F 3/047; G06F 3/0412; G06F 2203/04111; H01L 27/323; H01L 27/3246
See application file for complete search history.

(56) References Cited

U.S. PATENT DOCUMENTS 8,106,410 B2 * 1/2012 Sekiya ................ H01L 27/3248
257/88
8,816,331 B2 * 8/2014 Choi ...................... H01L 27/326
257/40
(Continued)

FOREIGN PATENT DOCUMENTS

| CN | 105762172 | 7/2016 |
|----|-----------|--------|
| CN | 108336116 | 7/2018 |

(Continued)

*Primary Examiner* — Grant Sitta

(57) ABSTRACT

The present disclosure provides an organic light emitting diode (OLED) display panel including a thin film transistor (TFT) layer, a planarization layer, a plurality of anodes, and a touch control module that are sequentially formed on the substrate. The touch control module is positioned in a gap between any two adjacent anodes. The display panel further includes a pixel defining layer disposed at least at two sides of the touch control module, wherein the pixel defining layer in combination with the touch control module defines a pixel area; a light-emitting layer disposed on the anodes to correspond to the pixel area; and a plurality of cathodes, arranged in an array, on the light-emitting layer. The touch control module is positioned in a gap between any two adjacent cathodes.

16 Claims, 2 Drawing Sheets

(56) References Cited

U.S. PATENT DOCUMENTS

| | | | |
|---|---|---|---|
| 9,155,498 B2* | 10/2015 | Akiyama | A61B 5/6801 |
| 9,348,439 B2* | 5/2016 | Liu | G06F 3/041 |
| 9,459,739 B2* | 10/2016 | Li | G06F 3/0443 |
| 9,921,708 B2* | 3/2018 | Kwak | G06F 3/047 |
| 10,514,791 B2* | 12/2019 | Ye | H01L 27/3246 |
| 10,580,836 B2* | 3/2020 | Yang | H01L 51/5225 |
| 10,665,661 B2* | 5/2020 | Park | H01L 51/5281 |
| 2011/0043464 A1* | 2/2011 | Lee | G06F 3/042 |
| | | | 345/173 |
| 2016/0380224 A1* | 12/2016 | Kim | H01L 51/0005 |
| | | | 257/40 |
| 2017/0075452 A1* | 3/2017 | Kim | G06F 3/0443 |
| 2018/0011573 A1* | 1/2018 | Yu | G02F 1/13394 |
| 2018/0101258 A1* | 4/2018 | Cho | G06F 3/044 |
| 2018/0356925 A1* | 12/2018 | Liu | G02F 1/13338 |
| 2019/0012022 A1* | 1/2019 | Ye | G06F 3/0445 |
| 2019/0204964 A1* | 7/2019 | Wang | G06F 3/0443 |
| 2019/0245013 A1 | 8/2019 | Yang et al. | |

FOREIGN PATENT DOCUMENTS

| | | | | |
|---|---|---|---|---|
| CN | 108364988 | | 8/2018 | |
| CN | 108493218 | | 9/2018 | |
| CN | 107704129 | | 8/2020 | |
| WO | WO-2019165826 A1 * | 9/2019 | | H01L 27/323 |

* cited by examiner

OLED DISPLAY PANEL

RELATED APPLICATIONS

This application is a National Phase of PCT Patent Application No. PCT/CN2018/123104 having International filing date of Dec. 24, 2018, which claims the benefit of priority of Chinese Patent Application No. 201811464089.1 filed on Dec. 3, 2018. The contents of the above applications are all incorporated by reference as if fully set forth herein in their entirety.

FIELD AND BACKGROUND OF THE INVENTION

The present disclosure relates to a field in display technology, and more particularly to an organic light emitting diode (OLED) display panel.

With advancement of technology, there are diverse display techniques developed. Organic light emitting diode (OLED) displays have outstanding properties, including higher brightness, wider color gamut, and smaller pixels, which allow displays to present more excellent display effects. In addition, more and more mobile devices utilize OLED devices, and OLED displays could have flexibility. Therefore, OLED displays are displays with which conventional thin film transistor-liquid crystal displays (TFT-LCDs) cannot compete. However, the structural design that OLED display panels have a touch control layer formed thereon has some disadvantages. For example, it is difficult to form a touch control layer because a process for forming same is complicated and thus displays have much higher manufacturing cost.

Accordingly, there is a need to solve the problems existing in prior art.

SUMMARY OF THE INVENTION

The present disclosure provides an organic light emitting diode (OLED) display panel, where difficulty for forming the touch control layer is lowered, the touch control layer also functions to seal side surface of the light-emitting layer, and reliability of the light-emitting layer is enhanced.

To solve the aforementioned problems, the present disclosure provides an organic light emitting diode (OLED) display panel, comprising:

a substrate;
a thin film transistor (TFT) layer disposed on the substrate;
a planarization layer disposed on the TFT layer;
a plurality of anodes, arranged in an array, on the planarization layer;
a touch control module positioned in a gap between any two adjacent anodes;
a pixel defining layer disposed at least at two sides of the touch control module, wherein the pixel defining layer in combination with the touch control module defines a pixel area;
a light-emitting layer, disposed on the anodes, to correspond to the pixel area;
a plurality of cathodes, arranged in an array, on the light-emitting layer; and
a thin film encapsulation layer disposed on the cathodes to encapsulate the light-emitting layer;
wherein the touch control module is positioned in a gap between any two adjacent cathodes.

In the OLED display panel of the present disclosure, the touch control module includes a first insulation layer, a metal grid touch control layer, a second insulation layer, a bridging layer, and a third insulation layer that are stacked from bottom to top.

In the OLED display panel of the present disclosure, the metal grid touch control layer is insulated from the anodes by the first insulation layer.

In the OLED display panel of the present disclosure, the metal grid touch control layer includes a plurality of touch control electrodes and a plurality of sensing electrodes insulated from each other, and a connection line; a through-hole is disposed in the second insulation layer, the sensing electrodes in a same row or column are connected to each other by the connection line, the touch control electrodes in a same row or column are connected to each other by the bridging layer via the through-hole.

In the OLED display panel of the present disclosure, both the touch control electrodes and the sensing electrodes are composed of a grid shaped metal wire, and position of the through-hole corresponds to an intersection of the grid shaped metal wires.

In the OLED display panel of the present disclosure, the first insulation layer, the second insulation layer, and the third insulation layer tightly seal the metal grid touch control layer.

In the OLED display panel of the present disclosure, the pixel defining layer is disposed on the touch control module to encapsulate the touch control module.

In the OLED display panel of the present disclosure, a width of the touch control module is less than or equal to a width of the gap between any two adjacent cathodes.

In the OLED display panel of the present disclosure, a height of the touch control module is greater than 1.5 µm.

In addition, the present disclosure provides an organic light emitting diode (OLED) display panel, comprising:

a substrate;
a thin film transistor (TFT) layer disposed on the substrate;
a planarization layer disposed on the TFT layer;
a plurality of anodes, arranged in an array, on the planarization layer;
a touch control module positioned in a gap between any two adjacent anodes;
a pixel defining layer disposed at least at two sides of the touch control module, wherein the pixel defining layer in combination with the touch control module defines a pixel area;
a light-emitting layer, disposed on the anodes, to correspond to the pixel area; and
a plurality of cathodes, arranged in an array, on the light-emitting layer;
wherein the touch control module is positioned in a gap between any two adjacent cathodes.

In the OLED display panel of the present disclosure, the touch control module includes a first insulation layer, a metal grid touch control layer, a second insulation layer, a bridging layer, and a third insulation layer that are stacked from bottom to top.

In the OLED display panel of the present disclosure, the metal grid touch control layer is insulated from the anodes by the first insulation layer.

In the OLED display panel of the present disclosure, the metal grid touch control layer includes a plurality of touch control electrodes and a plurality of sensing electrodes insulated from each other, and a connection line; a through-hole is disposed in the second insulation layer, the sensing electrodes in a same row or column are connected to each other by the connection line, the touch control electrodes in a same row or column are connected to each other by the bridging layer via the through-hole.

In the OLED display panel of the present disclosure, both the touch control electrodes and the sensing electrodes are composed of a grid shaped metal wire, and position of the through-hole corresponds to an intersection of the grid shaped metal wires.

In the OLED display panel of the present disclosure, the first insulation layer, the second insulation layer, and the third insulation layer tightly seal the metal grid touch control layer.

In the OLED display panel of the present disclosure, the pixel defining layer is disposed on the touch control module to encapsulate the touch control module.

In the OLED display panel of the present disclosure, a width of the touch control module is less than or equal to a width of the gap between any two adjacent cathodes.

In the OLED display panel of the present disclosure, a height of the touch control module is greater than 1.5 µm.

The advantageous effects provided by the present disclosure are that, compared to prior art, the present disclosure provides an OLED display panel which integrates the touch control assembly and the display assembly into a single body. The grid shaped metal wires are disposed between pixels and extend therebetween without overlapping the anodes and the light-emitting layer, so as to constitute the touch control electrodes and the sensing electrodes. Thus, difficulty for forming the touch control layer in the panels is lowered, and the touch control layer can be formed using general process. In addition, the cathodes are patterned to define a sensing space where the touch control layer is disposed. Moreover, the touch control module functions as a peripheral encapsulation layer to seal side surface of each single light-emitting layer, improving encapsulation of display panels.

BRIEF DESCRIPTION OF THE SEVERAL VIEWS OF THE DRAWINGS

To detailedly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DESCRIPTION OF SPECIFIC EMBODIMENTS OF THE INVENTION

Figure 1:
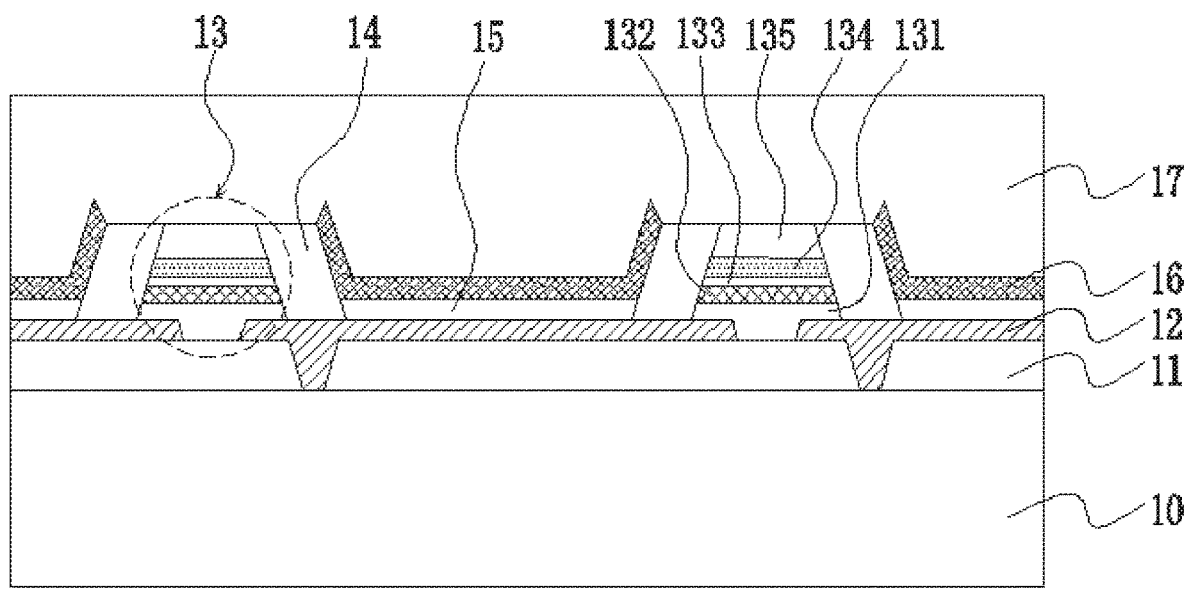
FIG. 1 shows a cross-sectional view of a structure of an organic light emitting diode (OLED) display panel according to one embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure solves the problems existing in the conventional organic light emitting diode (OLED) display panels, where it is difficult to form a touch control layer because a process for forming same is complicated and thus displays have higher manufacturing cost.

Please refer to FIG. 1, which shows a cross-sectional view of a structure of an organic light emitting diode (OLED) display panel according to one embodiment of the present disclosure. The OLED display panel includes:

a substrate 10;

a thin film transistor (TFT) layer (not shown) disposed on the substrate;

a planarization layer 11 disposed on the TFT layer;

a plurality of anodes 12, arranged in an array, on the planarization layer 11;

a touch control module 13 positioned in a gap between any two adjacent anodes 12;

a pixel defining layer 14 disposed at least at two sides of the touch control module 13, wherein the pixel defining layer 14 in combination with the touch control module 13 defines a pixel area;

a light-emitting layer 15, disposed on the anodes 12, to correspond to the pixel area; and a plurality of cathodes 16, arranged in an array, on the light-emitting layer 15, wherein each pixel corresponds to one cathode 16.

The touch control module 13 is positioned in a gap between any two adjacent cathodes 16. A thin film encapsulation layer 17 is disposed on the cathodes 16, the pixel defining layer 14, and the touch control module 13 to encapsulate the light-emitting layer 15.

The light-emitting layer 15 includes a hole injection layer, a hole transport layer, an electron blocking layer, a light-emitting layer, a hole blocking layer, an electron transport layer, and an electron injection layer. However, the light-emitting layer 15 is not limited to include such layers.

In one embodiment, the touch control module 13 includes a first insulation layer 131, a metal grid touch control layer 132, a second insulation layer 133, a bridging layer 134, and a third insulation layer 135 that are stacked from bottom to top. The pixel defining layer 14 is formed on an upper surface and a side surface of the touch control module 13. That is, the pixel defining layer 14 encapsulates the touch control module 13. Thus, the pixel defining layer 14 tightly seal the touch control module 13, enhancing reliability of the touch control module 13. In the meanwhile, because of tightness provided by the touch control module 13, the touch control module 13 functions to seal side surface of the light-emitting layer 15, thus encapsulating the light-emitting layer 15.

In one embodiment, the pixel defining layer 14 is disposed at two sides of the touch control module 13. The touch control module 13 has a height consistent with that of the pixel defining layer 14. The first insulation layer 131, the second insulation layer 133, the pixel defining layer, and the third insulation layer 135 together constitute an encapsulation structure that encapsulates the metal grid touch control layer 132. The metal grid touch control layer 132 is insulated from the anodes 12 by the first insulation layer 131. The metal grid touch control layer 132 covers a portion of the anodes without influencing aperture ratio of the light-emitting layer 15. The touch control module 13 also functions to seal side surface of the light-emitting layer 15.

In one embodiment, to form the touch control module 13, the patterned first insulation layer 131 is formed on the anodes 12 first. The patterned first insulation layer 131 is positioned between any two adjacent anodes 12 and adjoins the two anodes 12. The adjoining location does not affect the light-emitting layer 15 that is formed later on the anodes 12. Next, the metal grid touch control layer 132 is formed to be entirely disposed on the first insulation layer 131. Then, the patterned second insulation layer 133 is formed on the metal grid touch control layer 132, and the patterned bridging layer 134 is formed on the second insulation layer 133. Finally, the patterned third insulation layer 135 is formed on the patterned bridging layer 134. The touch control module 13 could have a shape of a rectangle or a trapezoid in a cross-sectional view.

In one embodiment, a height of the touch control module 13 is greater than 1.5 µm, so as to satisfactorily seal side surface of the light-emitting layer 15.

In one embodiment, the touch control module 13 has a width equal to or smaller than a gap between any two adjacent cathodes 16. Therefore, the patterned cathodes 16 define a sensing space where the metal grid touch control layer 132 is disposed, thus raising reliability of the metal grid touch control layer 132.

In addition, because the touch control module 13 is positioned between two adjacent light-emitting layers 15 and directly contacts the thin film encapsulation layer 17, the touch control module 13 is much closer to users' fingers, touch control sensitivity is remarkably increased. Moreover, because the touch control module 13 does not independently occupy any vertical space in the display panels, this helps fulfill light-weight and thin display panels.

In one embodiment, the cathodes 16 entirely cover the light-emitting layer 15, and the cathodes 16 extend to sidewalls of the pixel defining layer 14. This defines a sensing space where the touch control module 13 is disposed.

In one embodiment, the cathodes 16 extend to edge of the upper surface of the pixel defining layer 14, but do not cover the touch control module 13. This further enhances reliability that the cathodes 16 encapsulate the light-emitting layer 15.

Figure 2:
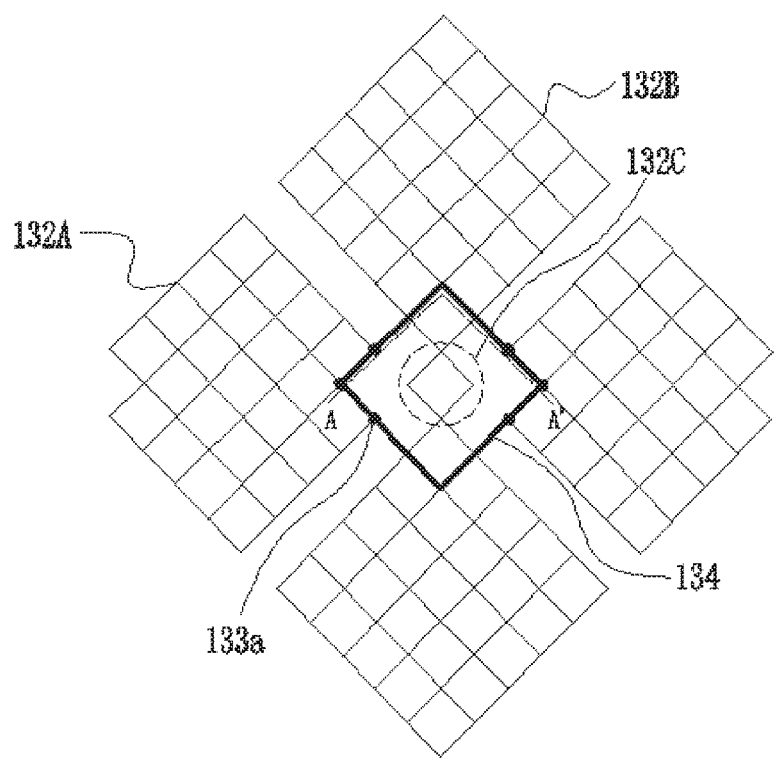
FIG. 2 shows a top plan view of a structure of a metal grid touch control layer according to one embodiment of the present disclosure.

Please see FIG. 2, which shows a top plan view of a structure of a metal grid touch control layer according to one embodiment of the present disclosure. An explanation for the subject invention is provided to use a mutual capacitive touch sensing control as an example. The metal grid touch control layer 132 includes a plurality of touch control electrodes 132A and a plurality of sensing electrodes 132B insulated from each other and disposed in the same layer, and a connection line 132C. The sensing electrodes 132B in a same row or column are connected to each other by the connection line 132C. FIG. 2 shows that the sensing electrodes 132B in the same column are connected to each other by the connection line 132C. Between the metal grid touch control layer 132 and the bridging layer 134 is the second insulation layer 133. A through-hole 133a is disposed in the second insulation layer 133. The touch control electrodes 132A in the same row are connected to each other by the bridging layer 134 via the through-hole 133a. Both the touch control electrodes 132A and the sensing electrodes 132B are composed of a grid shaped metal wire, and position of the through-hole 133a corresponds to an intersection of the grid shaped metal wires.

Figure 3:
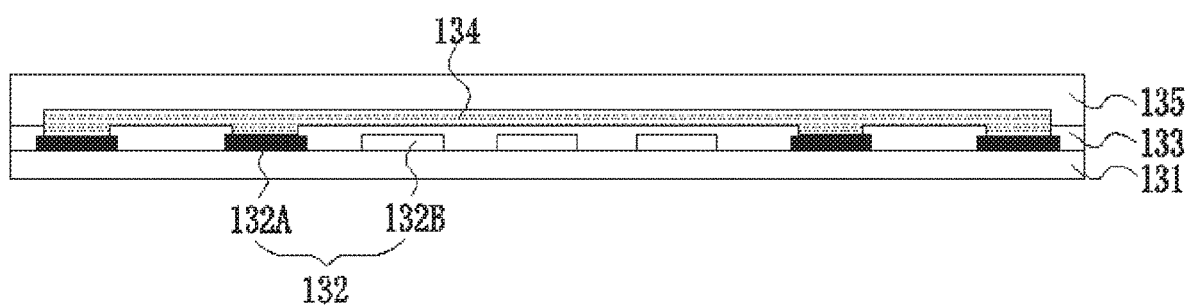
FIG. 3 is a cross-sectional view taken along line A-A' of FIG. 2.

Please refer to FIG. 3, which is a cross-sectional view taken along line A-A' of FIG. 2. The layered structure includes, from bottom to top, the first insulation layer 131, the metal grid touch control layer 132, the second insulation layer 133, the bridging layer 134, and the third insulation layer 135. Any two adjacent touch control electrodes 132A are electrically connected to each other by the bridging layer 134, and the bridging point corresponds to an intersection of the grid shaped metal wires of the touch control electrodes 132A. The sensing electrodes 132B are insulated from the bridging layer 134. Alternatively, the sensing electrodes 132B are electrically connected to each other by the bridging layer 134, and the touch control electrodes 132A are connected to each other by the connection line 132C.

Accordingly, the present disclosure provides an OLED display panel which integrates the touch control assembly and the display assembly into a single body. The grid shaped metal wires are disposed between pixels and extend therebetween without overlapping the anodes and the light-emitting layer, so as to constitute the touch control electrodes and the sensing electrodes. Thus, difficulty for forming the touch control layer in the panels is lowered, and the touch control layer can be formed by general processes. In addition, the cathodes are patterned to define a sensing space where the touch control layer is disposed. Moreover, the touch control module functions as a peripheral encapsulation layer to seal side surface of each single light-emitting layer, improving encapsulation of display panels.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light emitting diode (OLED) display panel, comprising:
    a substrate;
    a thin film transistor (TFT) layer disposed on the substrate;
    a planarization layer disposed on the TFT layer;
    a plurality of anodes, arranged in an array, on the planarization layer;
    a touch control module positioned in a gap between any two adjacent anodes;
    a pixel defining layer disposed at least at two sides of the touch control module, wherein the pixel defining layer in combination with the touch control module defines a pixel area;
    a light-emitting layer, disposed on the anodes, to correspond to the pixel area;
    a plurality of cathodes, arranged in an array, on the light-emitting layer; and
    a thin film encapsulation layer disposed on the cathodes to encapsulate the light-emitting layer;
    wherein the touch control module is positioned in a gap between any two adjacent cathodes; and
    wherein the touch control module includes a first insulation layer, a metal grid touch control layer, a second insulation layer, a bridging layer, and a third insulation layer that are stacked from bottom to top.

2. The OLED display panel according to claim 1, wherein the metal grid touch control layer is insulated from the anodes by the first insulation layer.

3. The OLED display panel according to claim 1, wherein the metal grid touch control layer includes a plurality of touch control electrodes and a plurality of sensing electrodes insulated from each other, and a connection line; a through-hole is disposed in the second insulation layer, the sensing electrodes in a same row or column are connected to each other by the connection line, the touch control electrodes in a same row or column are connected to each other by the bridging layer via the through-hole.

4. The OLED display panel according to claim 3, wherein both the touch control electrodes and the sensing electrodes are composed of a grid shaped metal wire, and position of the through-hole corresponds to an intersection of the grid shaped metal wires.

5. The OLED display panel according to claim 1 wherein the first insulation layer, the second insulation layer, and the third insulation layer tightly seal the metal grid touch control layer.

6. The OLED display panel according to claim 1, wherein the pixel defining layer is disposed on the touch control module to encapsulate the touch control module.

7. The OLED display panel according to claim 1, wherein a width of the touch control module is less than or equal to a width of the gap between any two adjacent cathodes.

8. The OLED display panel according to claim 1, wherein a height of the touch control module is greater than 1.5 μm.

9. An organic light emitting diode (OLED) display panel, comprising:
   a substrate;
   a thin film transistor (TFT) layer disposed on the substrate;
   a planarization layer disposed on the TFT layer;
   a plurality of anodes, arranged in an array, on the planarization layer;
   a touch control module positioned in a gap between any two adjacent anodes;
   a pixel defining layer disposed at least at two sides of the touch control module, wherein the pixel defining layer in combination with the touch control module defines a pixel area;
   a light-emitting layer, disposed on the anodes, to correspond to the pixel area; and
   a plurality of cathodes, arranged in an array, on the light-emitting layer;
   wherein the touch control module is positioned in a gap between any two adjacent cathodes; and
   wherein the touch control module includes a first insulation layer, a metal grid touch control layer, a second insulation layer, a bridging layer, and a third insulation layer that are stacked from bottom to top.

10. The OLED display panel according to claim 9, wherein the metal grid touch control layer is insulated from the anodes by the first insulation layer.

11. The OLED display panel according to claim 9, wherein the metal grid touch control layer includes a plurality of touch control electrodes and a plurality of sensing electrodes insulated from each other, and a connection line; a through-hole is disposed in the second insulation layer, the sensing electrodes in a same row or column are connected to each other by the connection line, the touch control electrodes in a same row or column are connected to each other by the bridging layer via the through-hole.

12. The OLED display panel according to claim 11, wherein both the touch control electrodes and the sensing electrodes are composed of a grid shaped metal wire, and position of the through-hole corresponds to an intersection of the grid shaped metal wires.

13. The OLED display panel according to claim 9, wherein the first insulation layer, the second insulation layer, and the third insulation layer tightly seal the metal grid touch control layer.

14. The OLED display panel according to claim 9, wherein the pixel defining layer is disposed on the touch control module to encapsulate the touch control module.

15. The OLED display panel according to claim 9, wherein a width of the touch control module is less than or equal to a width of the gap between any two adjacent cathodes.

16. The OLED display panel according to claim 9, wherein a height of the touch control module is greater than 1.5 μm.

* * * * *